(12) United States Patent
Chen

(10) Patent No.: US 7,491,645 B2
(45) Date of Patent: Feb. 17, 2009

(54) METHOD FOR MANUFACTURING A SEMICONDUCTOR DEVICE

(75) Inventor: Cheng-Chuan Chen, Tainan Hsien (TW)

(73) Assignee: Genesis Photonics Inc., Tainan Hsien (TW)

( * ) Notice: Subject to any disclaimer, the term of this patent is extended or adjusted under 35 U.S.C. 154(b) by 94 days.

(21) Appl. No.: 11/585,175

(22) Filed: Oct. 24, 2006

(65) Prior Publication Data

US 2007/0037306 A1  Feb. 15, 2007

Related U.S. Application Data

(63) Continuation-in-part of application No. 11/062,490, filed on Feb. 23, 2005, now Pat. No. 7,157,293, and a continuation-in-part of application No. 11/417,008, filed on May 2, 2006.

(30) Foreign Application Priority Data

May 4, 2006  (TW) .............................. 95115898 A

(51) Int. Cl.
*H01L 21/44* (2006.01)
(52) U.S. Cl. .................. 438/681; 438/732; 438/745; 438/513; 257/E21.17; 257/E21.218; 257/E21.229; 257/E21.347

(58) Field of Classification Search ................. 438/681, 438/680, 475, 513, 663, 724, 732, 744, 745, 438/753, 757
See application file for complete search history.

(56) References Cited

U.S. PATENT DOCUMENTS

| | | | | |
|---|---|---|---|---|
| 5,247,390 | A | * | 9/1993 | Hed ............................ 359/599 |
| 6,277,160 | B1 | * | 8/2001 | Stubbs et al. ................. 51/295 |
| 6,821,189 | B1 | * | 11/2004 | Coad et al. .................... 451/41 |
| 2008/0035052 | A1 | * | 2/2008 | Chen ........................... 117/95 |

* cited by examiner

*Primary Examiner*—David Nhu
(74) *Attorney, Agent, or Firm*—Stephen A Bent; Foley & Lardner LLP

(57) ABSTRACT

A method for manufacturing a semiconductor device includes: forming a protrusion-patterned layer on a substrate, the protrusion-patterned layer including a plurality of separated protrusions, each of which includes a base portion formed on the substrate and a top end portion opposite to the base portion; laterally growing a base layer on the top end portions of the protrusions of the protrusion-patterned layer in such a manner that each of the top end portions is covered by the base layer and that the base layer cooperates with the protrusions to define a plurality of cavities thereamong; thickening the base layer to a predetermined layer thickness; and separating the base layer from the substrate by destroying the protrusions of the protrusion-patterned layer.

15 Claims, 9 Drawing Sheets

METHOD FOR MANUFACTURING A SEMICONDUCTOR DEVICE

CROSS-REFERENCE TO RELATED APPLICATIONS

This application is a continuation-in-part of U.S. patent application Ser. Nos. 11/062,490 (hereinafter referred to as the '490 application) and 11/417,008 (hereinafter referred to as the '008 application), respectively filed on Feb. 23, 2005 and May 2, 2006, entitled "Method for Making a Semiconductor Light Emitting Device" and "Method for Manufacturing a Semiconductor Device." The '490 application claims priority of Taiwanese application no. 093131968, filed on Oct. 21, 2004, and the '008 application claims priority of Taiwanese application no. 094114375, filed on May 4, 2005.

This application claims priority of Taiwanese application no. 095115898, filed on May 4, 2006.

BACKGROUND OF THE INVENTION

1. Field of the Invention

This invention relates to a method for manufacturing a semiconductor device, more particularly to a method for manufacturing a semiconductor device involving laterally growing and thickening a base layer on a protrusion-patterned layer formed on a substrate, and separating the base layer from the substrate by destroying the protrusion-patterned layer.

2. Description of the Related Art

Referring to FIG. 1, a semiconductor device 13 for epitaxial growth of a gallium nitride-based light emitting diode is conventionally formed by epitaxy growth and laser-assisted lift-off techniques. In detail, the semiconductor device 13 is manufactured by preparing a substrate 11 made of silicon carbide (SiC) or sapphire ($\alpha$-$Al_2O_3$), forming a gallium nitride layer 12 having a thickness of 2 to 10 μm on the substrate 11 through metal organic chemical vapor deposition (MOCVD) techniques, thickening the gallium nitride layer 12 to a thickness greater than 100 μm through hydride vapor phase epitaxy (HVPE) techniques so as to form the semiconductor device 13, and applying a laser to a boundary between the substrate 11 and the gallium nitride layer 12 so as to break bonding therebetween and so as to separate the substrate 11 from the gallium nitride layer 12.

Advantageously, the expensive silicon carbide (SiC) or sapphire ($\alpha$-$Al_2O_3$) substrate 11 used in the above method can be reused, after being subjected to a suitable surface treatment. However, in the above method, numerous dislocations that took place across the gallium nitride layer 12 will extend into the semiconductor device 13 and cause the semiconductor device 13 to have a defect density ranging from $10^{11}$ to $10^{12}$ $\mu m^{-2}$. In addition, the bonding strength of the boundary between the substrate 11 and the gallium nitride layer 12 is not even, and bond-breaking operation of the boundary can cause surface damage to the semiconductor device 13. Hence, production yield of the semiconductor device 13 and quality of the light emitting diode made from such semiconductor device 13 are unsatisfactory.

Therefore, there is a need in the art to provide an economical method for manufacturing a semiconductor device with improved quality.

SUMMARY OF THE INVENTION

Therefore, the object of the present invention is to provide a method for manufacturing a semiconductor device. The method includes: forming a protrusion-patterned layer on a substrate, the protrusion-patterned layer including a plurality of separated protrusions, each of which includes a base portion formed on the substrate and a top end portion opposite to the base portion; laterally growing a base layer on the top end portions of the protrusions of the protrusion-patterned layer in such a manner that each of the top end portions is covered by the base layer and that the base layer cooperates with the protrusions to define a plurality of cavities there among; thickening the base layer to a predetermined layer thickness; and separating the base layer from the substrate by destroying the protrusions of the protrusion-patterned layer.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 5:
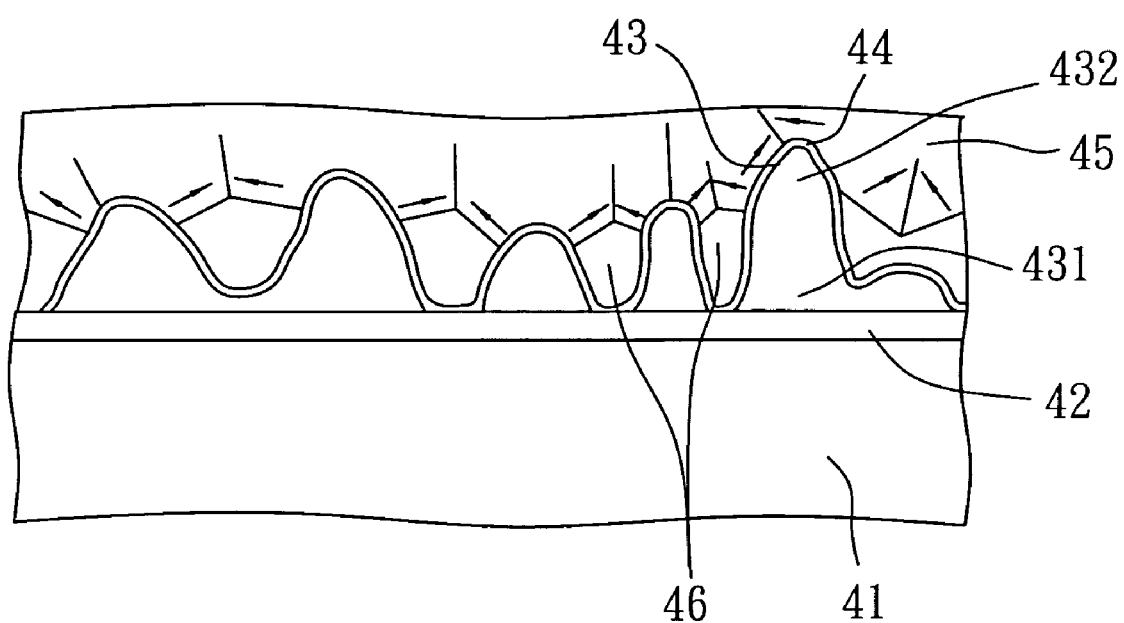
FIG. 5 is a fragmentary schematic view to illustrate the step of laterally growing a base layer on the barrier layer in the first preferred embodiment of the method of this invention.
Figure 6:
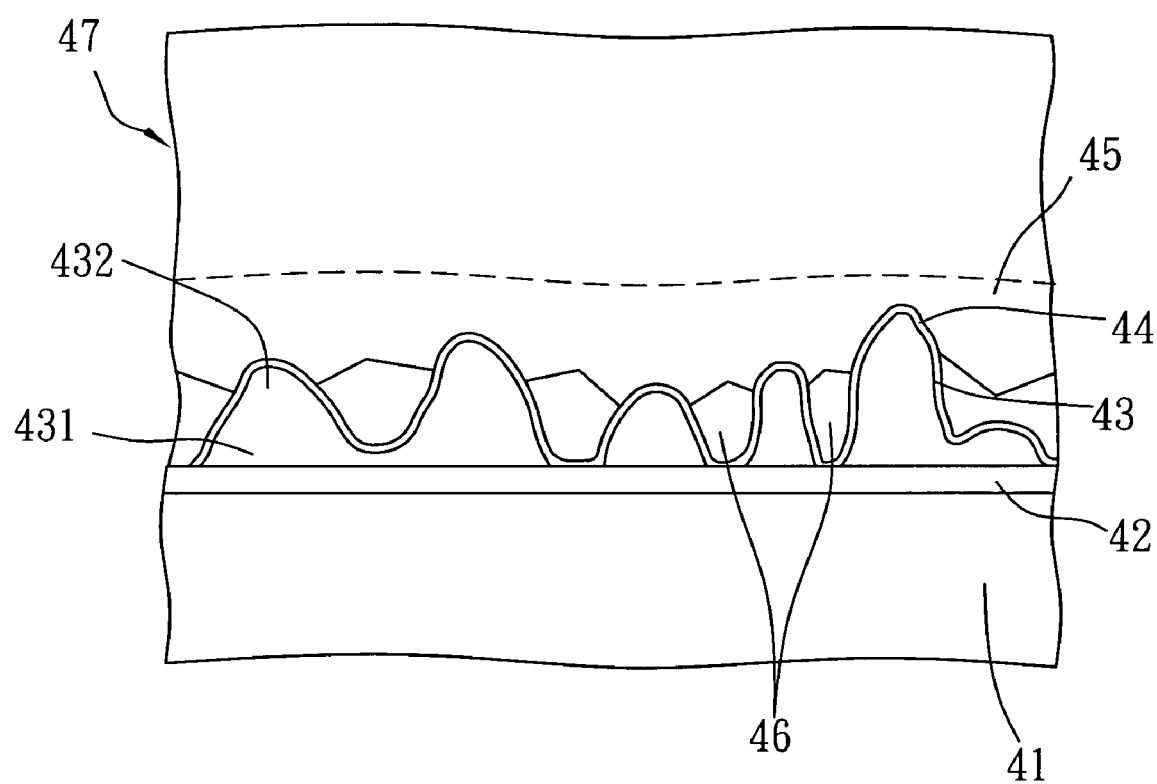
FIG. 6 is a fragmentary schematic view to illustrate the step of thickening the base layer in the first preferred embodiment of the method of this invention.
Figure 7:
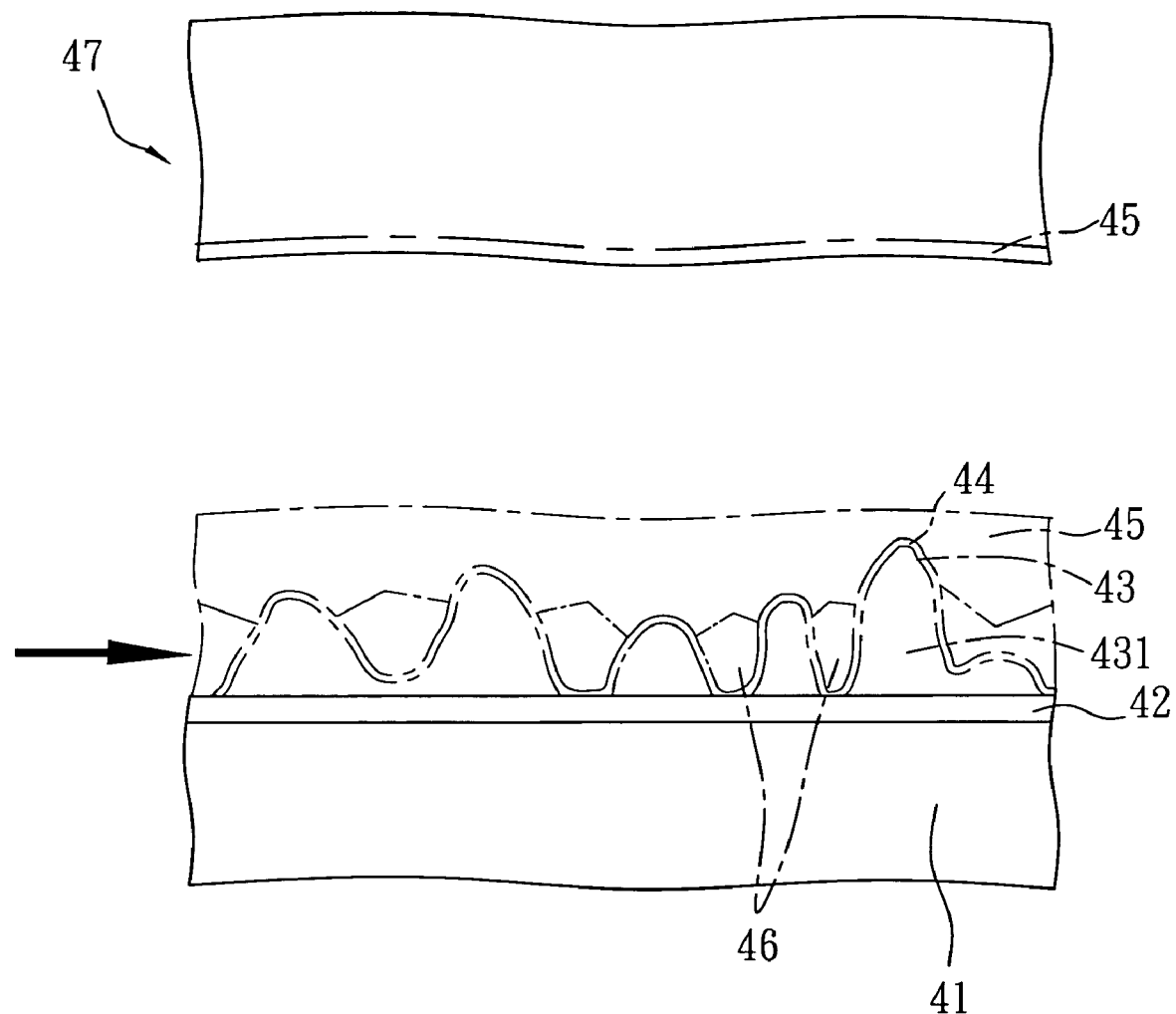
FIG. 7 is a fragmentary schematic view to illustrate the step of separating the base layer from the substrate in the first preferred embodiment of the method of this invention.

FIGS. 2 to 7 illustrate consecutive steps of a method of the first preferred embodiment according to this invention for manufacturing a semiconductor device 47. The method of the first preferred embodiment includes the steps of: forming a protrusion-patterned layer on a substrate 41 (FIG. 3), the protrusion-patterned layer including a plurality of separated protrusions 43, each of which includes a base portion 431 formed on the substrate 41 and a top end portion 432 opposite to the base portion 431; laterally growing a base layer 45 on the top end portions 432 of the protrusions 43 of the protrusion-patterned layer in such a manner that each of the top end portions 432 is covered by the base layer 45 and that the base layer 45 cooperates with the protrusions 43 to define a plurality of cavities 46 there among (FIG. 5); thickening the base layer 45 to a predetermined layer thickness (FIG. 6); and separating the base layer 45 from the substrate 41 by destroying the protrusions 43 of the protrusion-patterned layer (FIG. 7).

Preferably, the substrate 41 is made from a material selected from the group consisting of sapphire ($\alpha$-$Al_2O_3$), silicon carbide (SiC), zinc oxide (ZnO), aluminum nitride (AlN), and silicon (Si).

Figure 2:
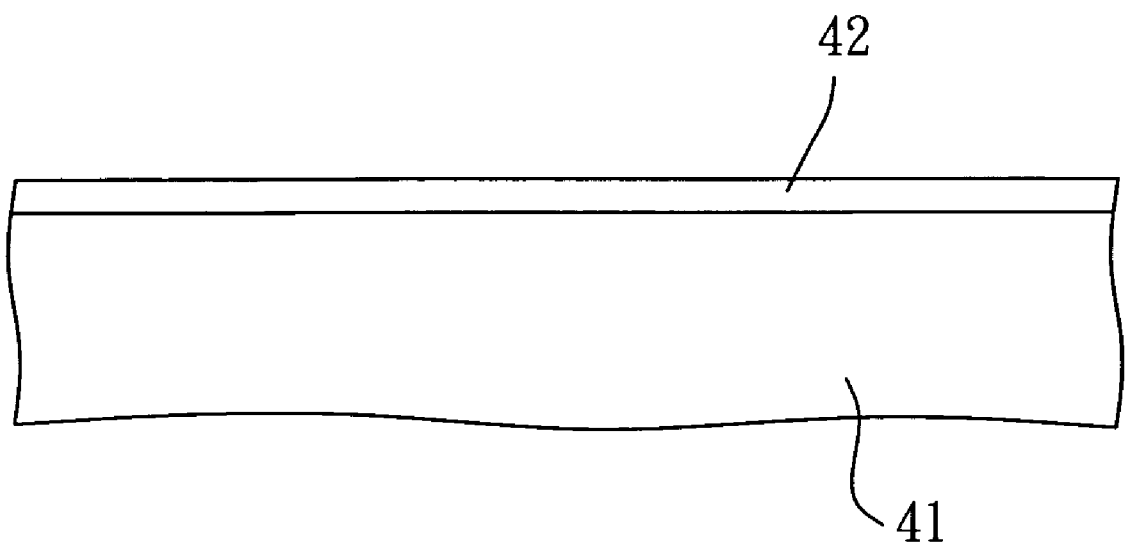
FIG. 2 is a fragmentary schematic view to illustrate the step of forming a seed layer on a substrate in the first preferred embodiment of a method for manufacturing a semiconductor device according to this invention.

Preferably, referring to FIG. 2, prior to formation of the protrusion-patterned layer on the substrate 41, a seed layer 42 is formed on the substrate 41. The seed layer 42 has a lattice constant mismatched with those of the substrate 41 and the protrusion-patterned layer.

More preferably, the seed layer 42 is made from a silicon nitride ($Si_3N_4$)-based compound. Most preferably, the seed layer 42 is made from silicon nitride ($Si_3N_4$).

The formation of the protrusion-patterned layer and the seed layer 42 on the substrate 41 may be conducted by placing the substrate 41 of sapphire on a susceptor in a reactor (not shown), subsequently heating the susceptor to a temperature of 600° C., followed by introducing a mixed flow of about 40 standard cubic centimeter per minute (sccm) of silane ($SiH_{4(g)}$) and about 40 standard liter per minute (slm) of ammonia ($NH_{3(g)}$) into the reactor so as to form the seed layer 42 of silicon nitride, having thickness larger than 1 Å, on the sapphire substrate 41 through reaction of silane with ammonia. Next, a hydrogen gas is introduced into the reactor and the temperature of the susceptor is raised to 1100° C. for annealing the sapphire substrate 41 and the seed layer 42 formed thereon.

Figure 3:
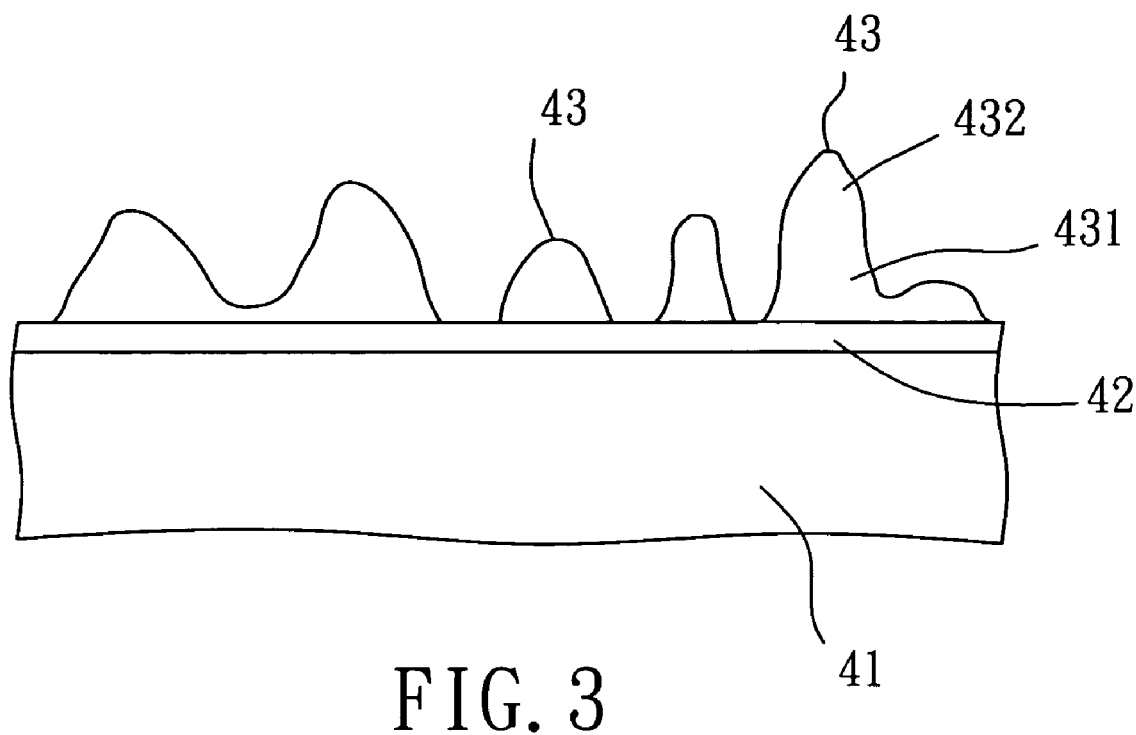
FIG. 3 is a fragmentary schematic view to illustrate the step of forming a protrusion-patterned layer on the seed layer in the first preferred embodiment of the method of this invention.

After formation of the seed layer 42 on the sapphire substrate 41, referring to FIG. 3, the protrusion-patterned layer may be formed on the seed layer 42 through metal organic chemical vapor deposition (MOCVD) techniques at a reaction temperature ranging from 500° C. to 1000° C. For example, the formation of the protrusion-patterned layer may be conducted by lowering the temperature of the susceptor to 800° C., and a mixed flow of 50 sccm of trimethylgallium ($TMGa_{(g)}$), 20 slm of $NH_{3(g)}$, and 0.5 sccm of $SiH_4(g)$, is introduced into the reactor, thereby forming the protrusion-patterned layer of GaN that includes a plurality of separated protrusions 43 on the seed layer 42. The base portion 431 of each protrusion 43 is epitaxially formed on the seed layer 42, and the top end portion 432 of each protrusion 43 extends from the base portion 431 in a substantially normal direction relative to the sapphire substrate 41 away from the seed layer 42. It is noted that if no $SiH_{4(g)}$ was introduced into the reactor during formation of the protrusion-patterned layer, the height-to-width ratio of each of the separated protrusions 43 will be reduced. Preferably, each of the protrusions 43 of the protrusion-patterned layer has an island shape.

Preferably, each of the protrusion-patterned layer and the base layer 45 is independently made from a gallium nitride-based compound. More preferably, the gallium nitride-based compound has a formula of $Al_xIn_yGa_{1-x-y}N$, in which $x \geq 0$, $y \geq 0$, and $1-x-y>0$.

Figure 4:
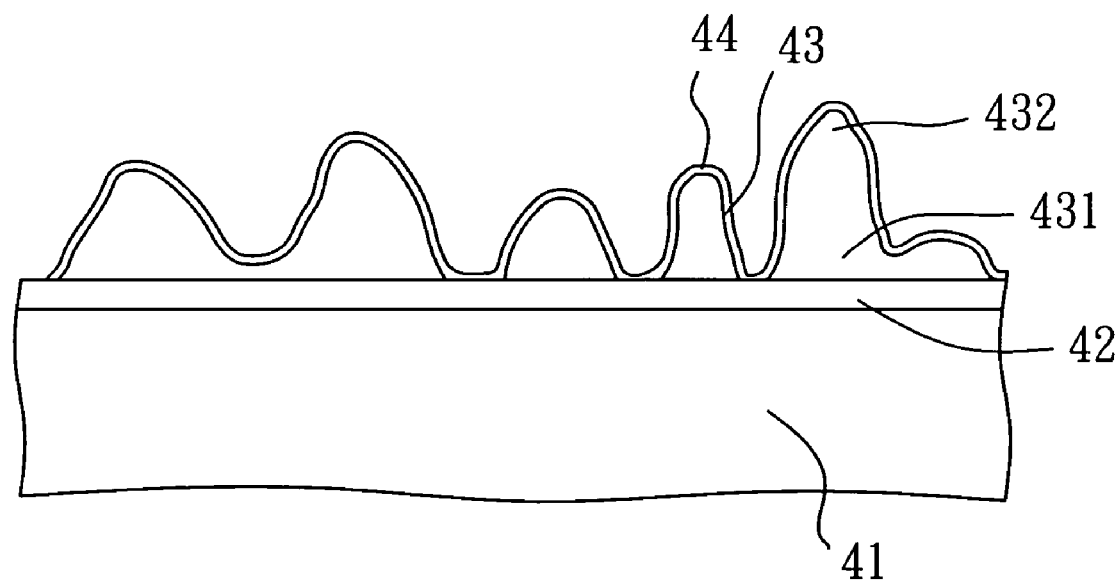
FIG. 4 is a fragmentary schematic view to illustrate the step of forming a barrier layer on the protrusion-patterned layer in the first preferred embodiment of the method of this invention.

Preferably, referring to FIG. 4, prior to formation of the base layer 45 on the protrusion-patterned layer, a barrier layer 44 is formed on the protrusion-patterned layer. More preferably, the barrier layer 44 has a lattice constant mismatched with that of the protrusion-patterned layer.

Preferably, the barrier layer 44 is made from a silicon nitride ($Si_3N_4$)-based compound. More preferably, the barrier layer 44 is made from silicon nitride ($Si_3N_4$). For example, the formation of the barrier layer 44 may be conducted by maintaining supply of $NH_{3(g)}$ and subsequently increasing supply of $SiH_{4(g)}$ to a flow rate of about 40 sccm. The barrier layer ($Si_3N_4$) 44 is formed on both the protrusion-patterned layer and a portion of the seed layer 42 that is not covered by the protrusion-patterned layer, as shown in FIG. 4. The barrier layer 44 thus formed has a thickness larger than 1 Å.

After formation of the barrier layer 44 on the protrusion-patterned layer, referring to FIG. 5, the base layer 45 may be laterally grown on the top end portions 432 of the protrusions 43 of the protrusion-patterned layer. Preferably, the formation of the base layer 45 on the top end portions 432 of the protrusions 43 of the protrusion-patterned layer is conducted by reacting a gallium source gas with an ammonia gas at a reaction temperature ranging from 900° C. to 1500° C.

For example, the formation of the base layer 45 may be conducted by raising the temperature of the susceptor to about 1000° C., followed by introducing 120 sccm of $TMGa_{(g)}$ and 20 slm of $NH_{3(g)}$ into the reactor. The base layer 45 of GaN is lateral-epitaxially grown on the portions of the barrier layer 44 formed on the top end portions 432 of the protrusions 43 of the protrusion-patterned layer in directions shown by the arrows (see FIG. 5), and has a thickness larger than 3 μm. The base layer 45 cooperates with the protrusions 43 covered with the barrier layer 44 to define a plurality of cavities 46 there among.

After the formation of the base layer 45, referring to FIG. 6, the base layer 45 is thickened to a predetermined thickness so as to form the semiconductor device 47. Preferably, the thickening operation of the base layer 45 is conducted through hydride vapor phase epitaxy (HVPE) techniques, and the thickened base layer 45 has a thickness larger than 100 μm.

After thickening the base layer 45, referring to FIG. 7, the base layer 45 is separated from the substrate 41 by destroying the protrusions 43 of the protrusion-patterned layer, thereby separating the semiconductor device 47 from the substrate 41.

The destruction of the protrusions 43 of the protrusion-patterned layer may be conducted using wet-etching techniques. The cavities 46 among the protrusions 43 permit an etching solution, such as KOH, HCl, $H_3PO_4$, and mixtures of HCl and $HNO_3$, to penetrate therethrough, thereby facilitating wet etching of the protrusions 43. Alternatively, the destruction of the protrusions 43 of the protrusion-patterned layer may be conducted through laser-assisted lift-off techniques.

Figure 8:
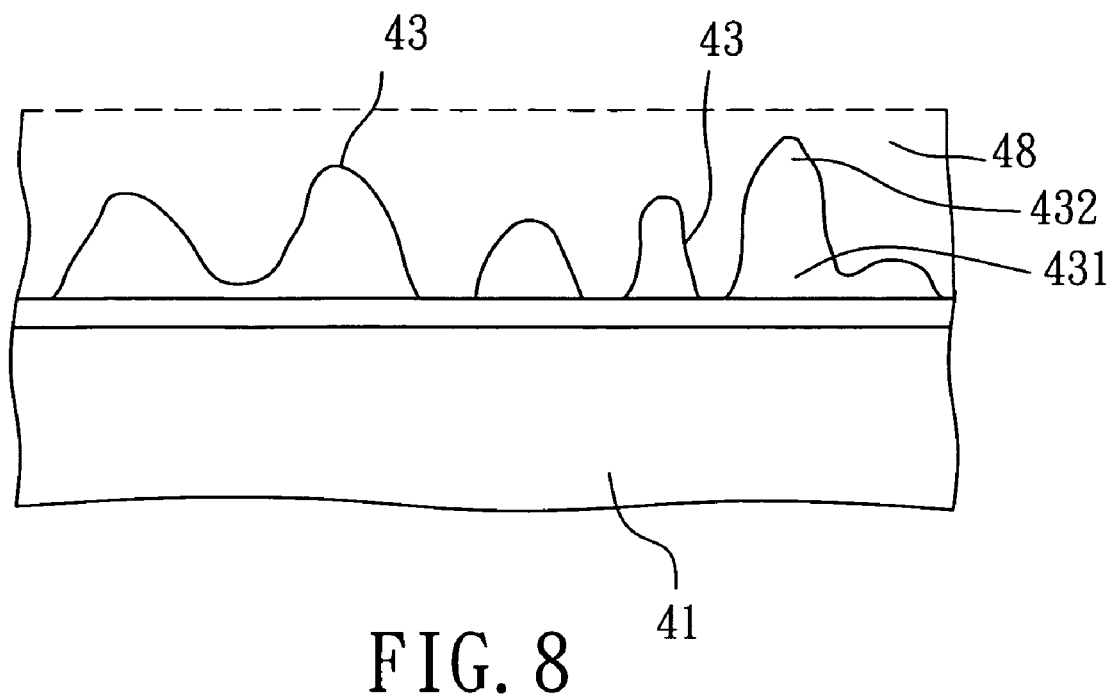
FIG. 8 is a fragmentary schematic view to illustrate the step of forming a protrusion-patterned layer on a substrate in the second preferred embodiment of the method of this invention.
Figure 9:
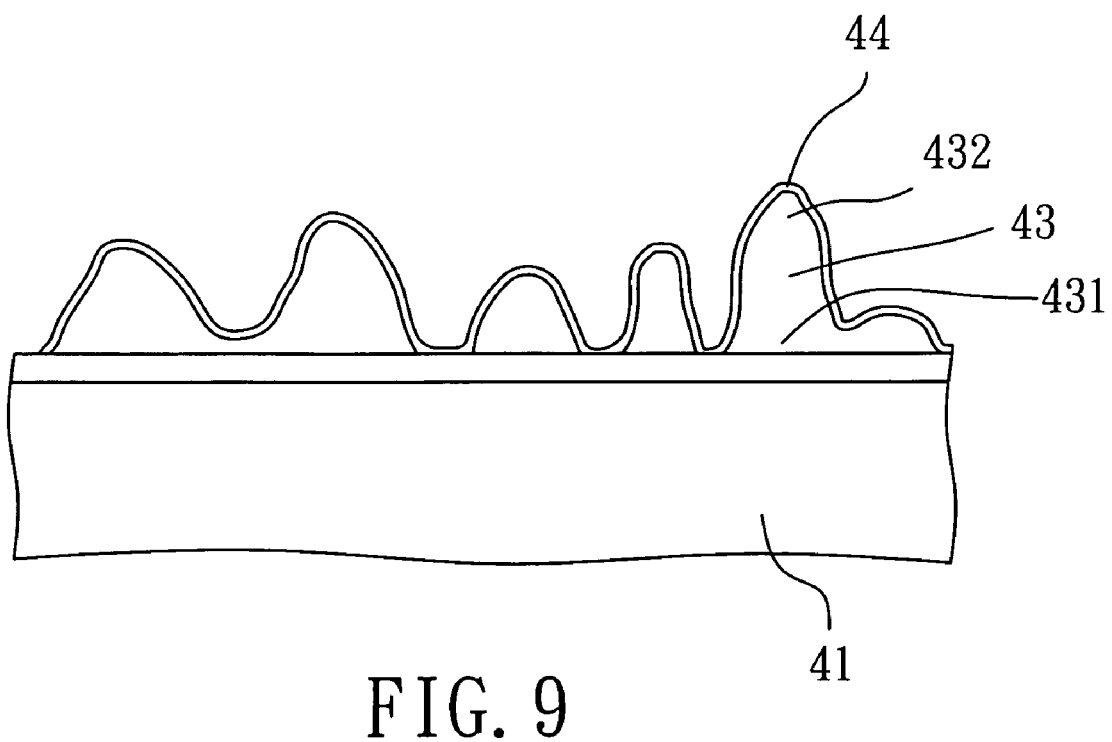
FIG. 9 is a fragmentary schematic view to illustrate the step of forming a barrier layer on the protrusion-patterned layer in the second preferred embodiment of the method of this invention.
Figure 10:
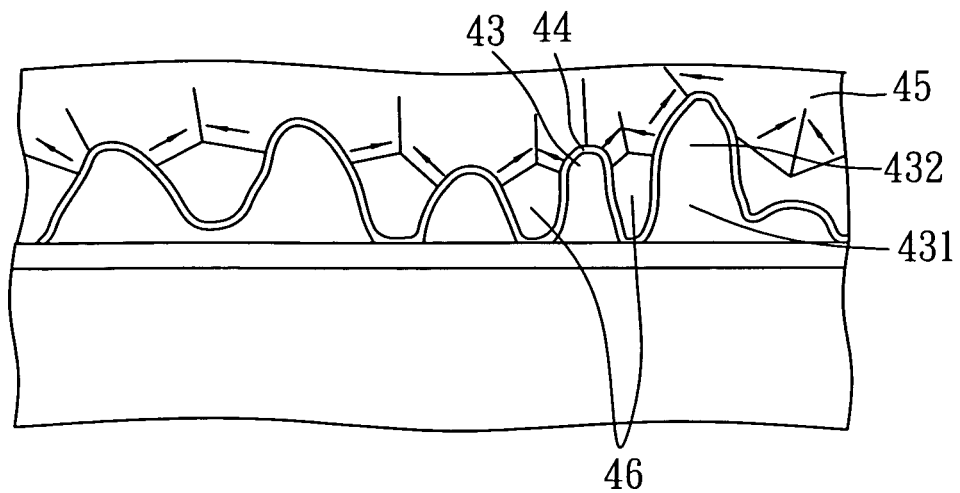
FIG. 10 is a fragmentary schematic view to illustrate the step of laterally growing a base layer on the barrier layer in the second preferred embodiment of the method of this invention.

FIGS. 8 to 12 illustrate consecutive steps of a method of the second preferred embodiment according to this invention for manufacturing a semiconductor device 47. The second preferred embodiment differs from the first preferred embodiment in the step of forming the protrusion-patterned layer on the substrate 41. Particularly, the formation of the protrusion-patterned layer on the substrate 41 includes the steps of: forming a lower temperature-formed continuous layer 48 of a gallium nitride-based compound on the substrate 41 by reacting the gallium source gas with the ammonia gas at a reaction temperature ranging from 450° C. to 750° C.; and subsequently raising the reaction temperature to 900° C. to 1100° C. and lowering the partial pressure of the ammonia gas so as to convert structurally the lower temperature-formed continuous layer 48 of the gallium nitride-based compound into the protrusion-patterned layer (FIG. 8).

For example, a mixed flow of 15 sccm of TMGa$_{(g)}$ and 20 slm of NH$_{3(g)}$ is introduced into a reactor at a temperature of 600° C. so as to form the lower temperature-formed continuous layer 48 of GaN covering the sapphire substrate 41. Next, the temperature is raised to 950° C., and the partial pressure of NH$_{3(g)}$ is lowered to 6 slm, thereby converting structurally the lower temperature-formed continuous layer 48 into the protrusion-patterned layer including a plurality of separated protrusions 43. Each protrusion 43 includes the base portion 431 formed on the substrate 41 and the top end portion 432 (See FIG. 8).

After forming the protrusion-patterned layer, supply of NH$_{3(g)}$ is maintained, and supply of SiH$_{4(g)}$ is subsequently increased to a flow rate of abut 40 sccm. The barrier layer (Si$_3$N$_4$) 44 is formed on both the protrusion-patterned layer and a portion of the seed layer 42 on the sapphire substrate 41 that is not covered by the protrusion-patterned layer. The barrier layer 44 has a thickness larger than 1 Å (See FIG. 9).

The temperature is subsequently raised to about 1000° C., and 120 sccm of TMGa$_{(g)}$ and 20 slm of NH$_{3(g)}$ are introduced into the reactor. The base layer 45 of GaN is lateral-epitaxially grown on the portions of the barrier layer 44 formed on the top end portions 432 of the protrusions 43 of the protrusion-patterned layer in directions shown by the arrows (see FIG. 10), and has a thickness larger than 3 μm. The base layer 45 cooperates with the protrusions 43 covered with the barrier layer 44 to define a plurality of cavities 46 there among (See FIG. 10).

Figure 11:
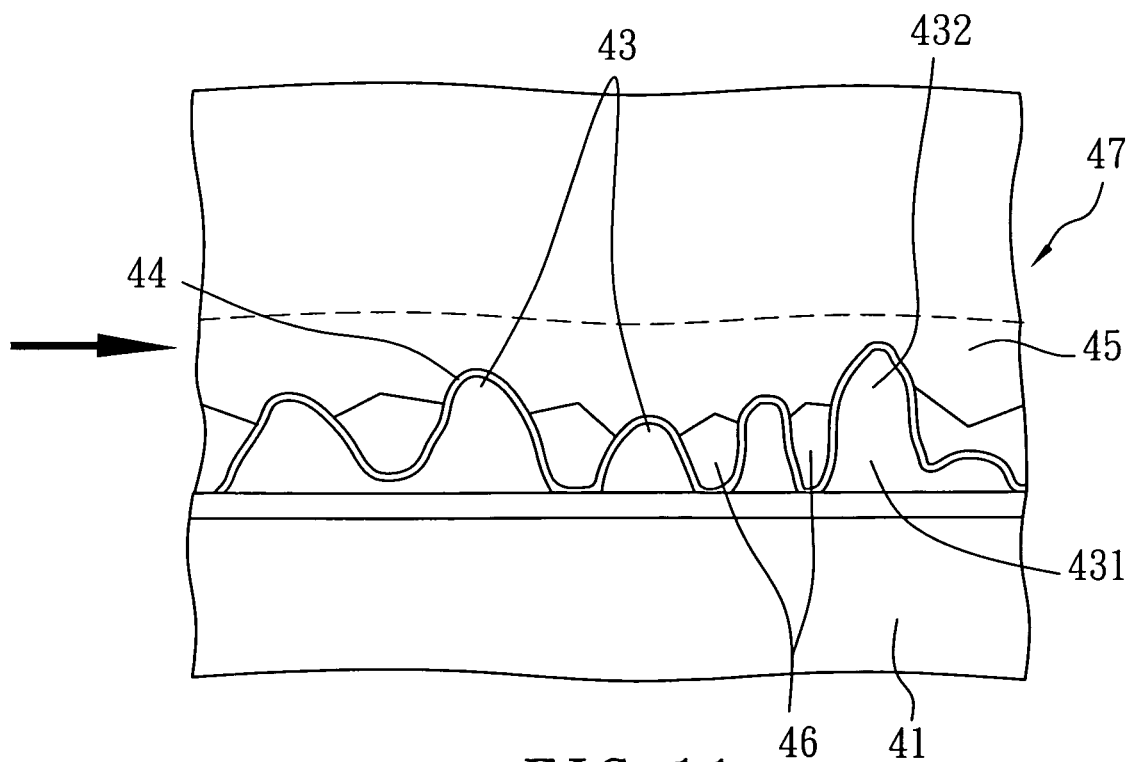
FIG. 11 is a fragmentary schematic view to illustrate the step of thickening the base layer in the second preferred embodiment of the method of this invention.

After the formation of the base layer 45, referring to FIG. 11, the base layer 45 is thickened to a predetermined thickness so as to form the semiconductor device 47. Preferably, the thickening operation of the base layer 45 is conducted through hydride vapor phase epitaxy (HVPE) techniques, and the thickened base layer 45 has a thickness larger than 100 μm.

Figure 12:
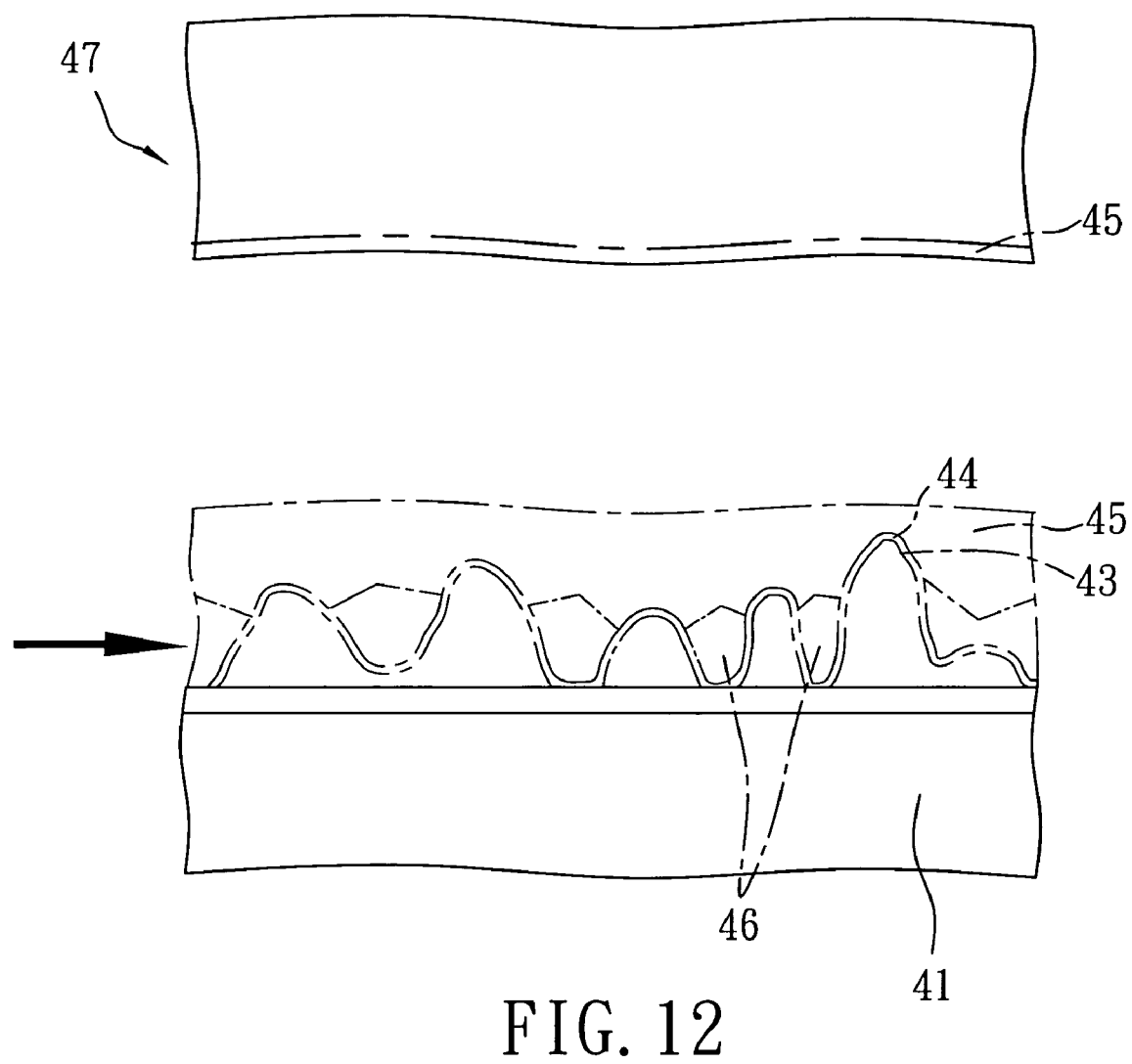
FIG. 12 is a fragmentary schematic view to illustrate the step of separating the base layer from the substrate in the second preferred embodiment of the method of this invention.

After thickening the base layer 45, referring to FIG. 12, the base layer 45 is separated from the substrate 41 by destroying the protrusions 43 of the protrusion-patterned layer, thereby separating the semiconductor device 47 from the substrate 41.

The destruction of the protrusions 43 of the protrusion-patterned layer may be conducted through wet-etching or laser-assisted lift-off techniques.

It should be noted that, in the first and second preferred embodiments of this invention, the formation of the seed layer 42 and the barrier layer 44 can be omitted without adversely affecting the quality of the semiconductor device 47.

In addition, by virtue of the lateral growth of the base layer 45 on the top end portions 432 of the protrusions 43 and the formation of the cavities 46, dislocations between the sapphire substrate 41 and the protrusion-patterned layer are prevented from extending upward into the base layer 45 through the seed layer 42 (if applied). Particularly, in the first and second preferred embodiments of this invention, the defect density of the base layer 45 and the semiconductor device 47 formed of the thickened base layer 45 is reduced to $10^6$ to $10^8$ μm$^{-2}$. Therefore, the quality of the light emitting diode made from the semiconductor device 47 can be greatly enhanced.

Moreover, as mentioned above, when separating the base layer 45 from the substrate 41 by destroying the protrusions 43 of the protrusion-patterned layer, the destruction of the protrusions 43 of the protrusion-patterned layer can be conducted using wet-etching techniques or laser-assisted lift-off techniques. Penetration of the etching solution through the cavities 46 not only facilitates wet etching of the protrusions 43 but also roughens the base layer 45 to have a nano-scale rough surface that is favorable for subsequent formation of semiconductor elements thereon.

Figure 1:
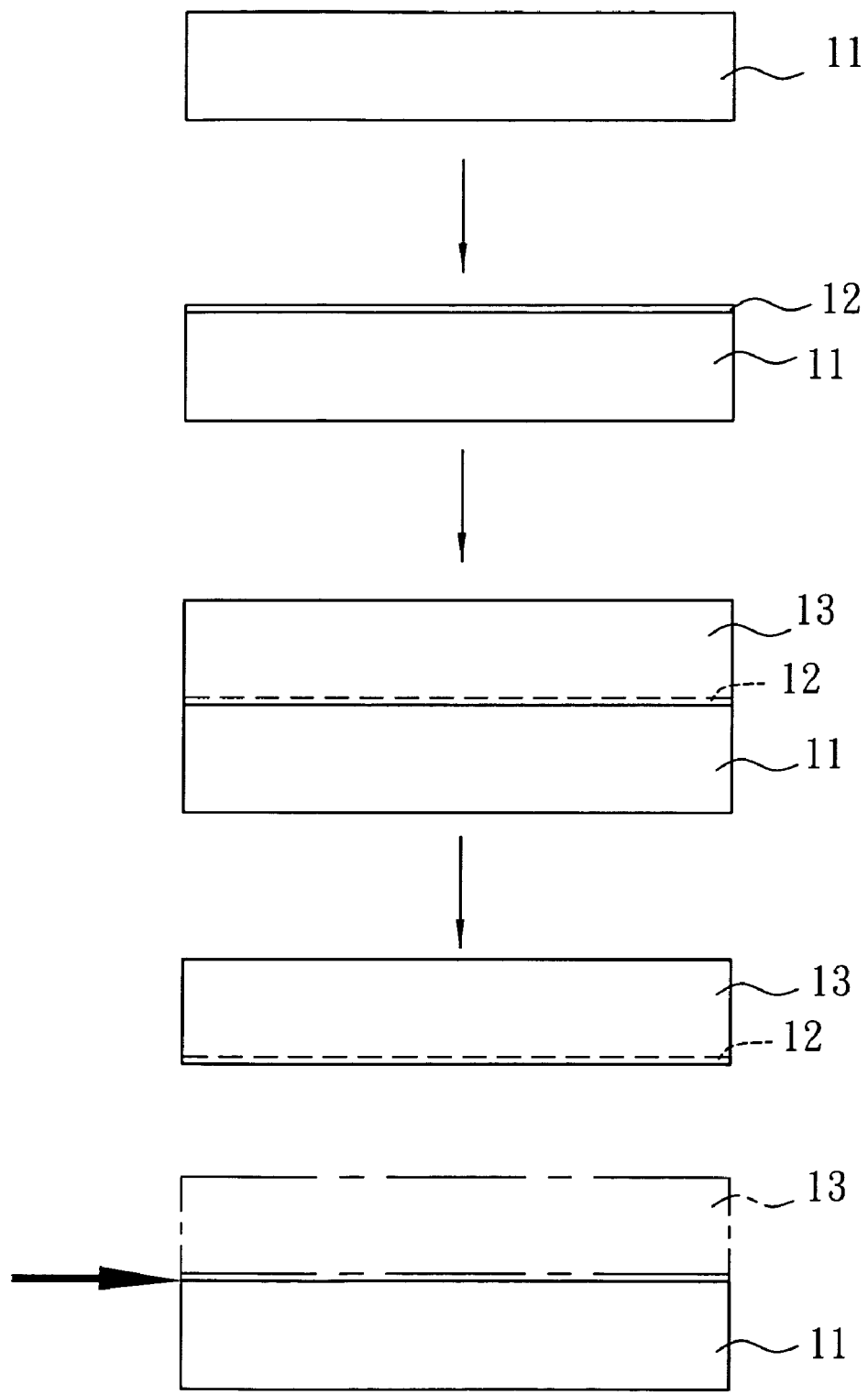
FIG. 1 is a schematic flow diagram to illustrate a conventional method for forming a semiconductor device involving laser-assisted lift-off techniques.

As for performing the destruction through the laser-assisted lift-off techniques, since the portions that need to be destroyed by the laser are the top end portions 432 of the protrusions 43 of the protrusion-patterned layer, and not a continuous lift-off layer, such as the gallium nitride layer 12 of FIG. 1, the production cost can be reduced and the surface damage encountered in the prior art and attributed to bond-breaking with laser can be avoided. Hence, production yield of the semiconductor device 47 thus made and the quality of the light emitting diode made from such semiconductor device 47 can be greatly enhanced.

While the present invention has been described in connection with what is considered the most practical and preferred embodiments, it is understood that this invention is not limited to the disclosed embodiments but is intended to cover various arrangements included within the spirit and scope of the broadest interpretation and equivalent arrangements.

What is claimed is:

1. A method for manufacturing a semiconductor device, comprising:
    forming a protrusion-patterned layer on a substrate, the protrusion-patterned layer including a plurality of separated protrusions, each of which includes a base portion formed on the substrate and a top end portion opposite to the base portion;
    laterally growing a base layer on the top end portions of the separated protrusions of the protrusion-patterned layer in such a manner that each of the top end portions is covered by the base layer and that the base layer cooperates with the separated protrusions to define a plurality of cavities there among;
    thickening the base layer to a predetermined layer thickness; and separating the base layer from the substrate by destroying the separated protrusions of the protrusion-patterned layer.

2. The method of manufacturing a semiconductor device according to claim 1, further comprising forming a seed layer on the substrate prior to forming the protrusion-patterned layer, the seed layer having a lattice constant mismatched with those of the substrate and the protrusion-patterned layer.

3. The method of manufacturing a semiconductor device according to claim 2, further comprising forming a barrier layer on the protrusion-patterned layer prior to laterally growing the base layer on the top end portions of the separated protrusions of the protrusion-patterned layer, the barrier layer having a lattice constant mismatched with that of the protrusion-patterned layer.

4. The method of manufacturing a semiconductor device according to claim 1, wherein the substrate is made from a material selected from the group consisting of sapphire (α-Al$_2$O$_3$), silicon carbide (SiC), zinc oxide (ZnO), aluminum nitride (AlN), and silicon (Si).

5. The method of manufacturing a semiconductor device according to claim 1, wherein each of the protrusion-patterned layer and the base layer is independently made from a gallium nitride-based compound.

6. The method of manufacturing a semiconductor device according to claim 5, wherein the gallium nitride-based compound has a formula of Al$_x$In$_y$Ga$_{1-x-y}$N, in which x≧0, y≧0, and 1−x−y>0.

7. The method of manufacturing a semiconductor device according to claim 3, wherein each of the seed layer and the barrier layer is independently made from a silicon nitride (Si$_3$N$_4$)-based compound.

8. The method of manufacturing a semiconductor device according to claim 3, wherein each of the seed layer and the barrier layer is independently made from silicon nitride ($Si_3N_4$).

9. The method of manufacturing a semiconductor device according to claim 1, wherein formation of the protrusion-patterned layer on the substrate is conducted through metal organic chemical vapor deposition techniques by reacting a gallium source gas with an ammonia gas.

10. The method of manufacturing a semiconductor device according to claim 9, wherein the formation of the protrusion-patterned layer on the substrate is conducted at a reaction temperature ranging from 500 degrees C. to 1100 degrees C.

11. The method of manufacturing a semiconductor device according to claim 9, wherein the formation of the protrusion-patterned layer on the substrate includes:

forming a continuous layer of a gallium nitride-based compound on the substrate by reacting the gallium source gas with the ammonia gas at a reaction temperature ranging from 450 degrees C. to 750 degrees C.; and subsequently raising the reaction temperature to 900 degrees C. to 1100 degrees C. and lowering the partial pressure of the ammonia gas so as to form the continuous layer of the gallium nitride-based compound into the protrusion-patterned layer.

12. The method of manufacturing a semiconductor device according to claim 1, wherein formation of the base layer on the top end portions of the separated protrusions of the protrusion-patterned layer is conducted by reacting a gallium source gas with an ammonia gas at a reaction temperature ranging from 900 degrees C. to 1500 degrees C.

13. The method of manufacturing a semiconductor device according to claim 1, wherein thickening of the base layer is conducted through hydride vapor phase epitaxy (HVPE) techniques.

14. The method of manufacturing a semiconductor device according to claim 1, wherein destruction of the separated protrusions of the protrusion-patterned layer is conducted through wet-etching techniques.

15. The method of manufacturing a semiconductor device according to claim 1, wherein destruction of the separated protrusions of the protrusion-patterned layer is conducted through laser-assisted lift-off techniques.

* * * * *